United States Patent
Guo et al.

(10) Patent No.: US 8,058,871 B2
(45) Date of Patent: Nov. 15, 2011

(54) MTJ BASED MAGNETIC FIELD SENSOR WITH ESD SHUNT TRACE

(75) Inventors: Yimin Guo, San Jose, CA (US); Grace Gorman, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 732 days.

(21) Appl. No.: 12/217,629

(22) Filed: Jul. 8, 2008

(65) Prior Publication Data

US 2010/0007344 A1    Jan. 14, 2010

(51) Int. Cl.
*G01R 33/02* (2006.01)
(52) U.S. Cl. .......................... 324/260; 324/244
(58) Field of Classification Search ................. 324/260, 324/244
See application file for complete search history.

(56) References Cited

U.S. PATENT DOCUMENTS

| | | | |
|---|---|---|---|
| 7,035,063 B2 | 4/2006 | Jayasekara | |
| 7,119,995 B2 | 10/2006 | Granstrom et al. | |
| 2003/0178705 A1 | 9/2003 | Gill | |
| 2004/0090716 A1 | 5/2004 | Jayasekara | |
| 2004/0196681 A1 | 10/2004 | Xiao et al. | |
| 2006/0071655 A1 | 4/2006 | Shoji | |
| 2006/0170529 A1 | 8/2006 | Shoji | |
| 2007/0063690 A1 | 3/2007 | De Wilde et al. | |
| 2007/0076328 A1 | 4/2007 | Jayasekara et al. | |

FOREIGN PATENT DOCUMENTS

WO  PCT/US2009/003973    11/2009

OTHER PUBLICATIONS

Co-pending US Patent HMG06-046, U.S. Appl. No. 11/788,912, filed Apr. 23, 2007, "MTJ Sensor Including Domain Stable Free Layer," assigned to the same assignee as the present invention.

*Primary Examiner* — Reena Aurora
(74) *Attorney, Agent, or Firm* — Saile Ackerman LLC; Stephen B. Ackerman

(57) ABSTRACT

Presented herein is a shunted MTJ sensor formed of a plurality of electrically connected MTJ cells for measuring magnetic fields and currents and its method of fabrication. To provide stable single domain magnetic moments of the MTJ cells and to ensure that the magnetic moments return to a fixed bias point in the absence of external magnetic fields, the cells are formed of sufficiently small size and with elliptical cross-section of aspect ratio greater than 1.2. To eliminate the possibility of ESD damage to the cells, they are protected by a parallel shunt, formed as a trace of sufficiently high resistance that directs accumulated charges harmlessly to ground while bypassing the cells.

21 Claims, 4 Drawing Sheets

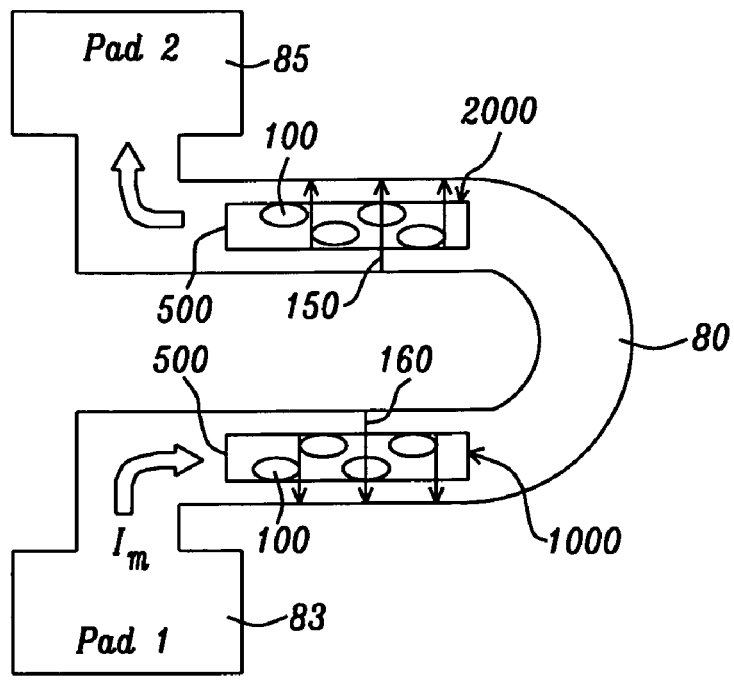
FIG. 1A – Prior Art
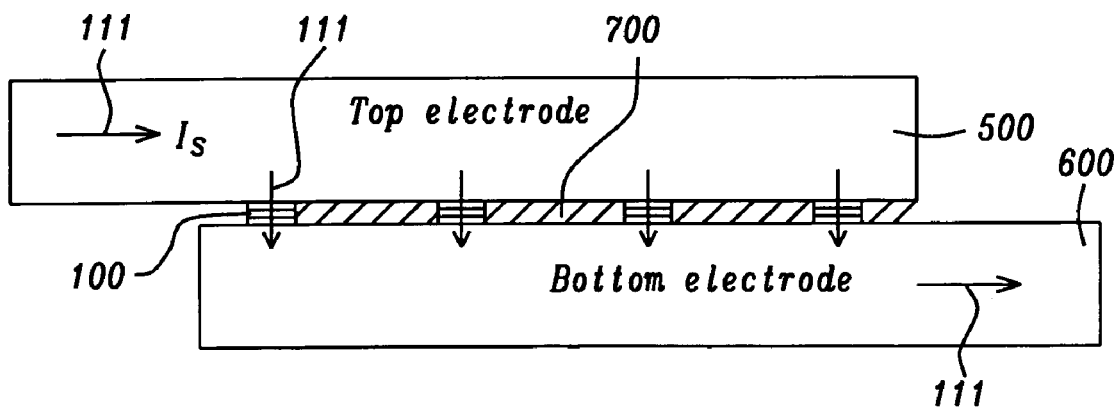
FIG. 1B – Prior Art

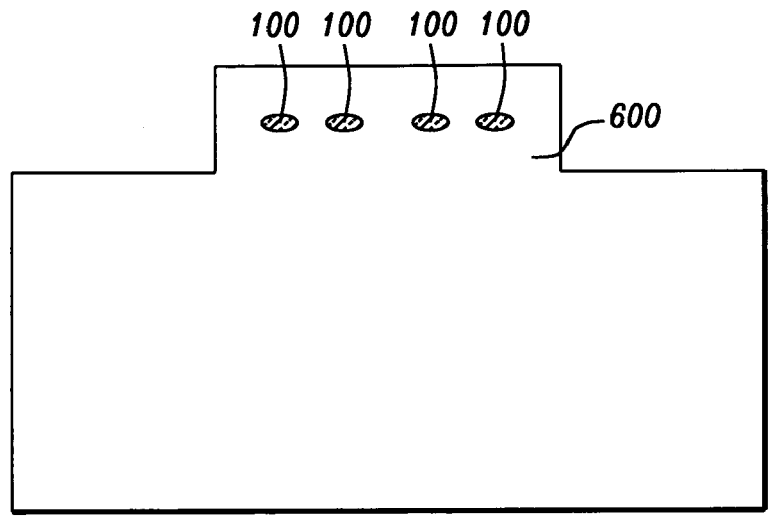
FIG. 3B
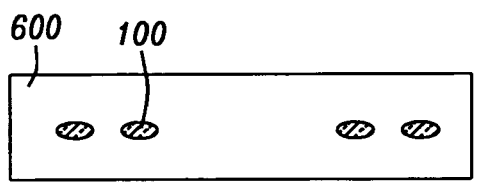
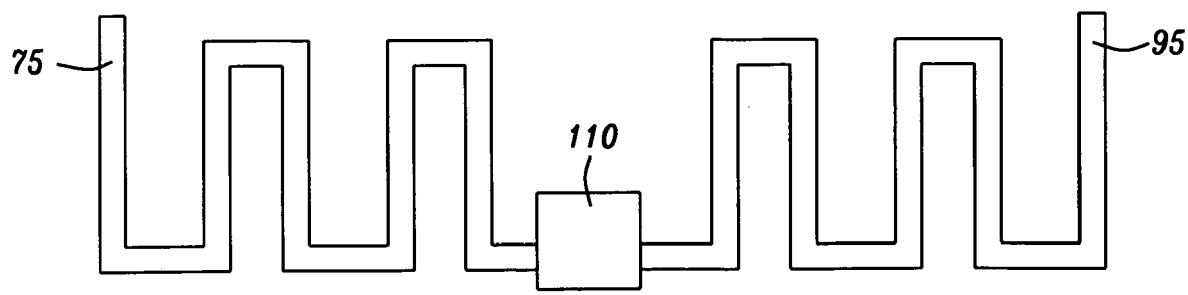
FIG. 3C

MTJ BASED MAGNETIC FIELD SENSOR WITH ESD SHUNT TRACE

RELATED PATENT APPLICATION

This Application is related to Ser. No. 11/788,912, filed on Apr. 23, 2007 and assigned to the same assignees as the present Application.

BACKGROUND OF THE INVENTION

1. Field of the Invention

This invention relates to a magnetic field sensor using an MTJ junction cell. In particular, it relates to the use of such a magnetic field sensor also as a current sensor and to a method of protecting the sensor from electrostatic discharge (ESD) by means of a shunt.

2. Description of the Related Art

Basic Operation of GMR and MTJ Cells

Two types of small, multilayered magnetic devices that change their resistance in response to variations in an external magnetic field are presently in wide use in technologies such as read heads in hard disk drives and magnetic information storage devices or MRAM. These two device types are the GMR, or giant magnetoresistive device and the MTJ or magnetic tunneling junction device. The devices are similar in that both include a pair of thin, magnetized ferromagnetic layers separated by a nonmagnetic layer. In the case of the GMR device, the nonmagnetic layer is a conductor, such as copper. In the case of the MTJ device, the nonmagnetic layer is a dielectric, such as aluminum oxide. The physical basis behind the operation of the GMR device is that when the two ferromagnetic layers are magnetized in different directions, the electrons in a current passing through one ferromagnetic layer towards the other ferromagnetic layer, through the intervening copper layer, are scattered differently in the various material layers and at their interfaces according to the directions of their spins relative to the directions of the magnetic moments. This spin-dependent scattering makes the GMR device act like a variable resistor.

The variable resistance of the MTJ device, on the other hand, does not result from spin-dependent scattering, but from spin-dependent tunneling. The layer between the two magnetized ferromagnetic layers in the MTJ device is not a conductor, but is a dielectric of such thinness that electrons nevertheless have a probability of tunneling through it from one ferromagnetic layer to the other. This probability, however, depends of the spin direction of the tunneling electron relative to the magnetic moment of the ferromagnetic layer towards which it is tunneling. When the electrons first pass through a reference layer of ferromagnetic material that is magnetized in one direction, their normally randomized spin directions are preferentially aligned with this magnetization. Then, their probability of tunneling through the intervening dielectric "tunneling barrier" layer depends of the magnetization direction of the ferromagnetic layer towards which they are proceeding. Since the present invention will deal with MTJ type devices, their structure will be described in some further detail below with reference to FIG. 3.

Basic Operation of a Current Sensor

Referring now to FIG. 1A, there is shown a schematic overhead illustration of how a prior art structure containing patterned MTJ cells has already been used to measure a current passing through a conductor of particular shape by measuring the strength of its magnetic field at particular places. This particular prior art structure is shown in related patent application U.S. Ser. No. 11/788,912, Filing Date Apr. 23, 2007, that is fully incorporated herein by reference. Shoji, in US Published Patent Applications (2006/0071655) and (2006/0170529) teaches the use of unpatterned GMR cells to measure the current in conductors of various shapes.

According to the illustration in this figure, $I_m$, a current to be measured (signified by a large open arrow), enters into an exemplary horseshoe-shaped conductor (80) at a contact denoted "Pad 1" (83) and leaves at Pad 2 (85). Two MTJ current-sensing structures, (1000), (2000), are positioned adjacent to the conductor as shown. For exemplary purposes only, each of these structures is a configuration of four (other numbers being possible) identical elliptically patterned MTJ cells, (100), connected electrically in parallel by a pair of electrodes, one electrode contacting the tops of the cells, and the other electrode contacting their bases. Only the top electrode (500), in each structure can be seen in this overhead view, a side view in FIG. 1B will clarify the electrode positioning.

Each sensor structure (1000) and (2000) is supplied with its own current, $I_s$, which enters and leaves through the electrodes. This current, which will be shown clearly in FIG. 1B, is for sensing purposes and will allow the variations in MTJ cell resistance to be converted into measurable variations in voltage across the cells. If the sensing current, $I_s$, is fixed, the measurable voltages will be related directly to the angle between the magnetic moments of the ferromagnetic layers. For sensing and measuring the strengths of external magnetic fields, the individual cells might be initially magnetized so that one ferromagnetic layer (the "pinned" layer) has its magnetic moment fixed in direction while the other ferromagnetic layer's magnetic moment is free to move (the "free" layer). The magnetic moments of the free and pinned layers are perpendicular to each other, with the pinned direction being along the shorter axis of the elliptical cell and the free direction being along the long axis. With these magnetization directions, the direction of the external magnetic field (arrows (150) and (160)) induced by the current, $I_m$, in the conductor can most effectively vary the direction of the free layer's magnetic moment and the amount of variation would be indicated by the voltage drop across the cell.

By placing the cells alongside the two opposite sides of the horseshoe shaped conductor as shown in the figure, they experience the induced magnetic field of $I_m$ in opposite directions as shown by the two sets of magnetic field arrows (150), (160) (which are directed along the short axes of the elliptical cells and, therefore, are perpendicular to the free layer magnetization). Then, a differential amplifier (not shown) measures the difference between voltage drops. The difference signal produced by the differential amplifier eliminates random temperature-induced noise fluctuations from the cells and any effects of stray external magnetic fields because these fluctuations are cancelled out, but the oppositely directed magnetic fields cause the current produced voltage drops to be of opposite value and, therefore, to add. It is noted that the two sensor structures (1000) and (2000) may be formed in physical contact with the conductor (80), but not in electrical contact.

Referring to FIG. 1B, one of the structures of FIG. 1A, either (1000) or (2000) is illustrated in a schematic side view. The top and bottom electrodes are now distinguishable as (500) and (600) and the same four cells, (100), are now shown as multilayered devices in a side cross-sectional view. The cells would be separated from each other by a dielectric material (700) that was deposited after the cells were formed on the lower electrode and then patterned and planarized to provide a smooth planar surface for contacting the MTJ cell upper surface with the top electrode. Although it is not indicated in the figure, the bottom electrode may be in physical contact with the conductor ((80) in FIG. 1A) but separated from it by an insulating layer.

If a current, $I_s$, (shown as entering arrow (111)) is injected into top electrode (500) and extracted from bottom electrode (600) (also shown as exiting arrow (111)), it will pass through the cells (100), as shown by the downward directed arrows (111). If the resistances of these cells are substantially equal, as would be the case if the angles between their free and pinned magnetic moments are the same, each cell will experience the same voltage drop and an equal current will pass through each of them.

Protecting the Sensor From Electrostatic Discharge (ESD)

The MTJ junctions of MTJ cells normally have a very low breakdown voltage (less than 2 volts) and are highly susceptible to damage from electrostatic discharge (ESD) during handling, packaging and assembly. When an MTJ cell is exposed to ESD, the junction may be totally or partially damaged and the sensing device of which it is a part will malfunction.

The prior art discloses several methods to protect MTJ cells from ESD damage. Jayasekara et al. (US Published Patent Application 2007/0076328) forms a shunt out of ferromagnetic material to protect an MTJ cell in a hard disk drive. Granstrom et al. (U.S. Pat. No. 7,119,995) discloses an ESD shunt designed to protect a MTJ read head during fabrication. The shunt is removed after fabrication.

Both of the shunts taught above are directed at single MTJ read heads to be used in a hard disk drive environment. MTJ cells to be used as current sensors operate in a different environment and are configured differently. What is needed, therefore, is a mechanism to protect MTJ cells in a current sensor configuration from the effects of ESD.

SUMMARY OF THE INVENTION

A first object of this invention is to provide a method of protecting an MTJ based current sensor from ESD.

A second object of this invention is to provide an MTJ based sensor for the measurement of current or magnetic field strength that is protected from ESD.

A third object of the present invention is to provide a mechanism for ESD protection that both prevents static charge buildup and provides a safe path for charge dissipation.

A fourth object of the present invention is to provide an ESD-protected MTJ sensor that includes single domain, hysteresis-free MTJ cells to eliminate non-reproducibility of measurements.

The objects of the present invention will be achieved by the use of an array of single domain MTJ sensors with domain restoration and resulting lack of hysteresis provided by a shape asymmetry and with ESD protection provided by conducting traces of relatively high resistance that serve to shunt electrostatic discharges away from the cells themselves and safely to ground.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1A is a schematic overhead view of a prior art current measurement device that makes use of properly patterned MTJ cells preferably formed from the configuration of layers shown in FIG. 4.

FIG. 1B is a schematic side cross-sectional view of the prior art device of FIG. 1A, showing the patterned MTJ cells formed between upper and lower current injecting and extracting electrodes.

FIG. 3A-FIG. 3D is a sequence of schematic illustrations of a method of forming the ESD shunting traces and the patterned MTJ cells for one of the exemplary current measuring structures in FIG. 2.

DESCRIPTION OF THE PREFERRED EMBODIMENTS

The preferred embodiment of the present invention is an ESD-protected current measuring device comprising two sensing structures placed at selected positions alongside a current carrying conductor. It is noted that the placement is preferably such that the sensing structures are physically in contact with the current carrying conductor, but not in electrical contact with it, e.g., separated from the conductor surface by a layer of insulating material. Each structure is formed as a plurality of electrically parallel MTJ cells that are themselves in parallel with a shunt trace that carries accumulated electrostatic charges harmlessly to ground, bypassing the MTJ cells. In a preferred configuration, the conductor is horseshoe-shaped and two sets of an equal number of MTJ cells, four being an exemplary number, are connected in parallel between upper and lower electrodes, and are placed on opposite sides of the horseshoe so that they experience current-produced magnetic fields that are oppositely directed. The voltage drops across the MTJ cells, which are changed in opposite signs, are analyzed by a differential amplifier so that the measured voltage is doubled, but random noise fluctuations and the effects of stray magnetic fields are eliminated. To provide stable single domain magnetic moments of the MTJ cells and to ensure that the magnetic moments return to a fixed bias point in the absence of external magnetic fields, the cells are formed of sufficiently small size and with elliptical cross-section of aspect ratio greater than 1.2. To eliminate the possibility of ESD damage to the cells, they are protected by a parallel shunt, formed as a trace of sufficiently high resistance, that directs accumulated charges to ground while bypassing the cells.

Figure 2:
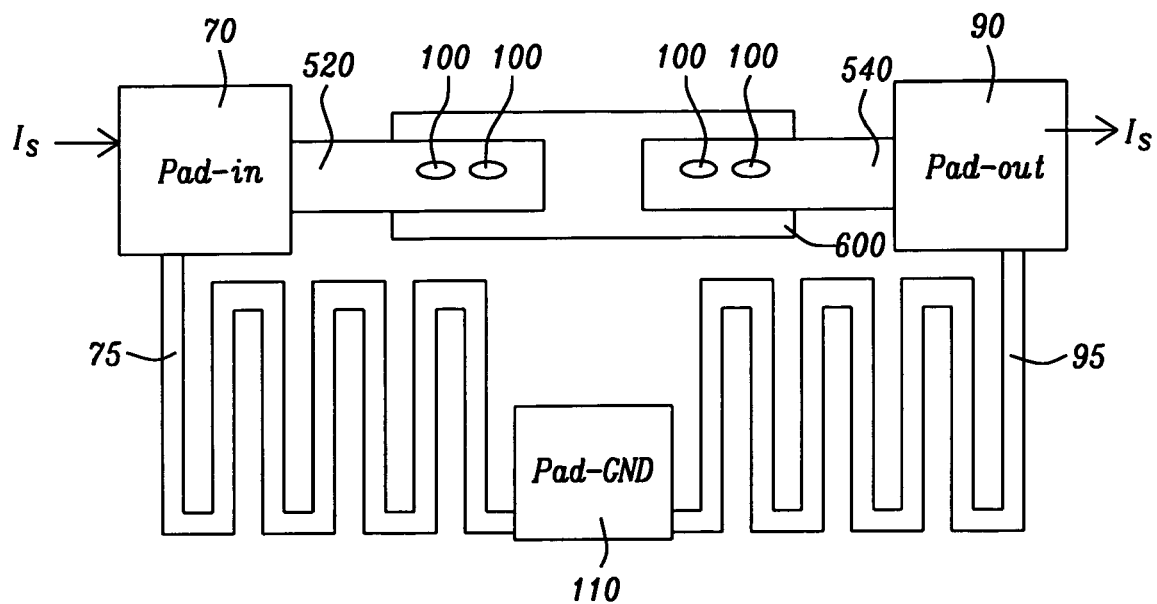
FIG. 2 is a schematic overhead view of the MTJ structures of FIG. 1A and FIG. 1B also showing the protective ESD shunt traces.

Referring to FIG. 2, there is shown a version of either of the two measuring structures, (1000) or (2000), in FIG. 1A, formed to meet the objects of the present invention. This version includes a shunt trace, (75) and (95), that protects the four MTJ cells (100). In the shunted formation, the upper electrode, (shown as a single element (500) in FIG. 1A), is now divided into two separated portions, (520) and (540). The bottom electrode remains as a single element (600). It is noted that this particular electrode design is but one of many that could be utilized as, for example, FIG. 1A shows a single top electrode.

Current, $I_s$, is injected through a contact denoted "Pad-in" (70) and is extracted from the contact denoted "Pad-out" (90). A conducting trace (75) is formed as a ribbon of conducting material between (70) and a ground connecting pad (110) and an identical trace (95) is formed between (90) and the ground connecting pad (110).

Figure 3A:
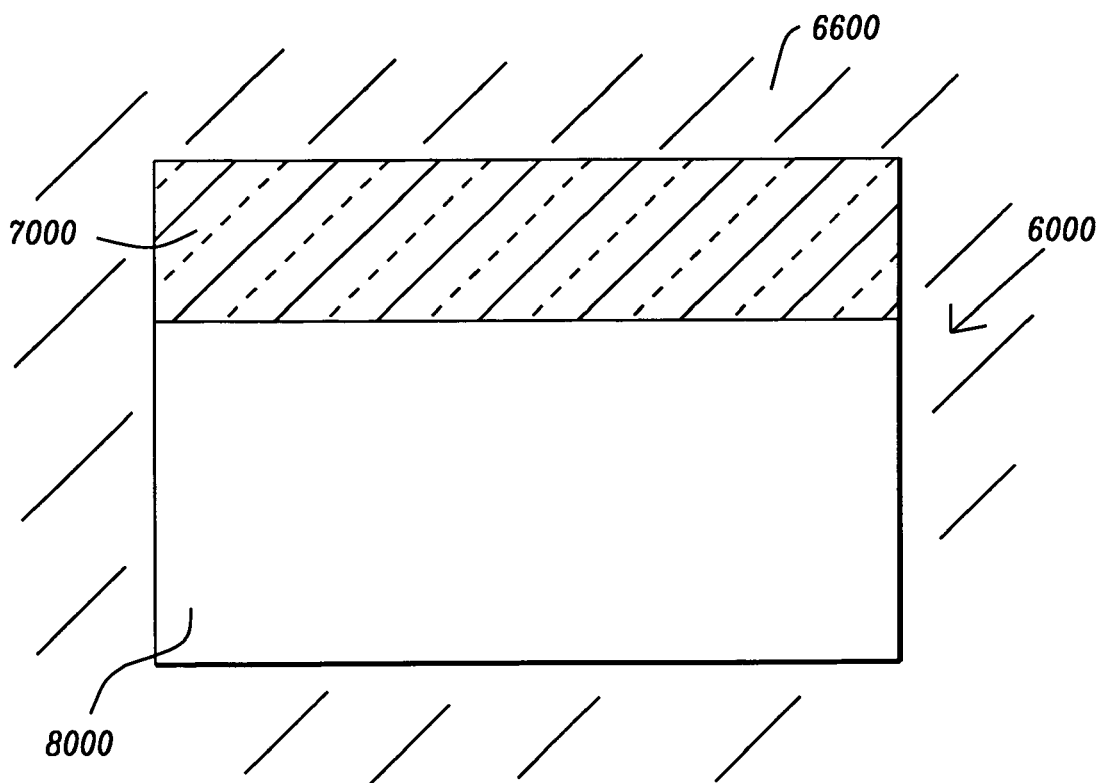

The method of forming the particular structure shown in FIG. 2 is as follows, however, it is understood that other electrode formations that would satisfy the objects of the invention are also possible. Referring first to FIG. 3A, there is shown schematically the deposition on a dielectric substrate (6600) of a layer of conducting material (6000). The dielectric substrate (6600) could be a layer of insulation separating the sensor to be formed from an underlying conductor whose current is to be measured.

The layer of conducting material (6000) will ultimately be patterned to form both the trace and the bottom electrode of the configuration of MTJ cells forming the sensor Preferably, this layer should be a conducting material of high resistivity, such as amorphous Ta or TaN. A multilayer deposition (shown as a shaded region (7000)), to be more fully described in FIG. 4 below, includes all the layers of an MTJ cell configuration and is formed over a region of the conducting layer. The remainder (8000) of the conducting layer (6000) will be patterned to form the traces. Alternatively, two separate conducting layers could be deposited, one layer to form the bottom electrode and the other to form the traces. In that case, the region shown as (8000) would be disjoint from the region shown as (7000) and each region could be formed of a different material.

Referring next to FIG. 3B, there is shown the results of photolithographic patterning of the MTJ multilayer ((7000) in FIG. 3A) to form four MTJ cells (100) of horizontal elliptical cross-section contacting the bottom electrode. The patterning process is well known in the prior arts.

Referring to FIG. 3C, there is shown schematically how, in another, single, photolithographic patterning process, the bottom conducting layer is then patterned to form a bottom electrode (600) underneath MTJ cells and the conducting trace is patterned as two separate wires (75) and (95). Ends of this construction are connected to an external ground pad (110). Because the traces are sufficiently distant from the MTJ cells, a single photolithographic mask can be used to pattern both traces simultaneously. The traces must be of sufficiently high resistance so that too much current is not shunted away from the MTJ cells during actual operation of the sensor. For a typical MTJ sensor structure such as that shown in this figure the preferred resistance is less than 2000 ohms. This requires that the traces have a preferred resistance of as high as 20,000 ohms, yielding a current shunting of less than 5%.

Figure 3D:
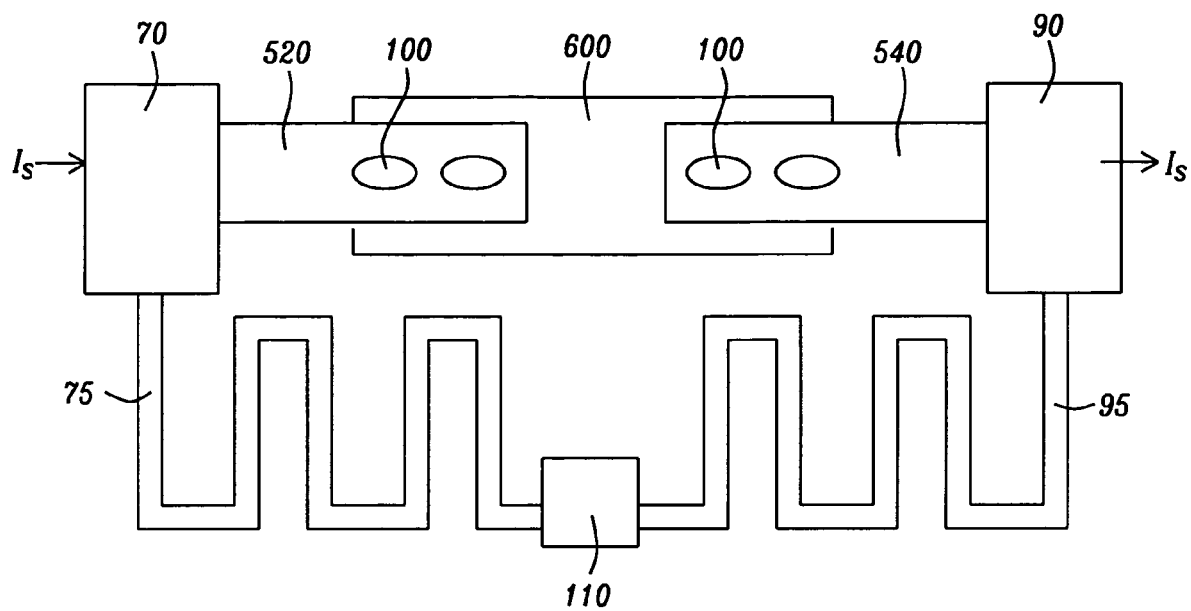

Referring finally to FIG. 3D, there is shown the formation of two pad areas, (70), and (90). Pads (70) and (90) will ultimately connect the two trace portions (75) and (95) to the MTJ cells by means of the upper electrode which is yet to be formed, while pad (110) will form a connection from the traces to ground. The grounding pad (110) has already been connected to a true ground, before any of the other pads are bonded. The space between the MTJ cells is then refilled by a dielectric material (not shown), which is planarized by a process such as CMP to expose the top surfaces of the MTJ cells in a smooth and coplanar configuration with the dielectric. Two conducting upper electrodes (520) and (540) are formed between the pads (70) and (90) to cover the planarized top surfaces of the MTJ cells (100). Note that the pads (70) and (90) may be formed after the formation of the electrodes (520) and (540), the sequence of operations being somewhat flexible.

Figure 4:
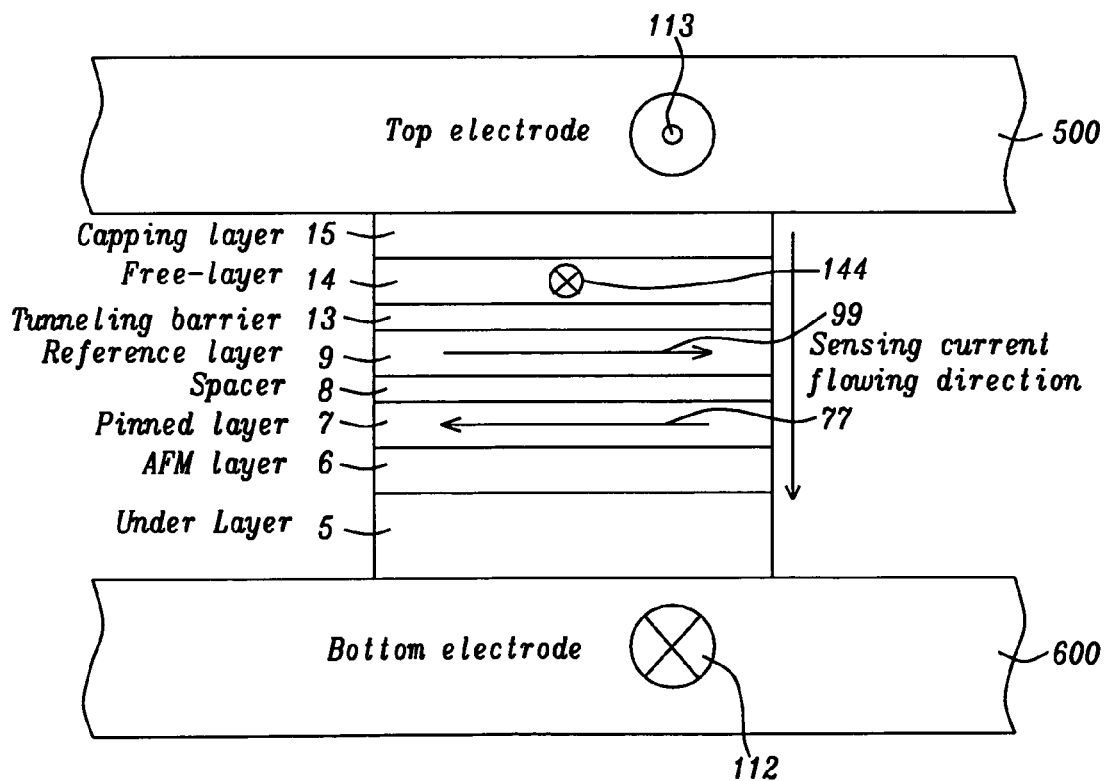
FIG. 4 is a schematic illustration of a patterned configuration of layers that, when shunted, form the MTJ cell of the present invention.

Referring now to FIG. 4, there is shown, schematically, a vertical cross-sectional diagram of the layer configuration of the patterned MTJ cell formed in FIG. 3A and patterned in FIG. 3B. As indicated in FIG. 3A, the cell is formed between a bottom electrode (600) and a top electrode (500). A dot in a circle (113) symbolically indicates the current in the upper electrode is out of the figure plane, while a cross in a circle (112) indicates that the current in the bottom electrode is into the figure plane. Downward directed arrow (111) indicates (for exemplary purposes) that the current through the MTJ cell is from top to bottom.

The cell configuration comprises the following sequential order of layers. First, an underlayer (5) is formed on the bottom electrode (600). Next, an antiferromagnetic layer (6), such as a layer of PtMn, IrMn, FeMn or NiO is deposited on the underlayer. This layer will serve as a pinning layer. Next a synthetic pinned multi-layer structure is formed. This structure comprises a pinned layer (7), a non-magnetic spacer layer (8) and a reference layer (9). The spacer layer is preferably formed of Ru, Rh or Cr and the pinned and reference layers are preferably formed of a ferromagnetic material such as CoFeB, CoFe or multi-layers of such materials. The antiferromagnetic layer pins the magnetic moment direction (arrow 77) of the pinned layer (7) which then couples to the oppositely directed magnetic moment (arrow 99) of the reference layer across the spacer layer. The coupling of the antiferromagnetic layer to the pinned layer and the coupling of the pinned layer to the reference layer across the spacer layer are all accomplished by means of thermal annealing process in the presence of a magnetic field that is parallel to the magnetic field that will be induced by the current, $I_m$, to be measured in the conductor ((80) in FIG. 1). A tunneling barrier layer (13), which is preferably a layer of dielectric material such as AlOx, AlNx, AlNxOy or MgOx, is formed on the reference layer, a free layer (14), which is preferably a layer of soft magnetic material such as NiFe, is formed to a thickness between approximately 1.5 and 5 nm on the tunneling barrier layer and a capping layer (15) is formed on the free layer. The magnetic moment (144) of the free layer is, when quiescent, is perpendicularly directed relative to the pinned layer and, when influenced by the induced field of the conductor will change its angle relative to the magnetization of the pinned layer. Consequently, the moment is shown as being into (cross in circle) the drawing plane and is free to move in response to external magnetic fields. A capping later (15) is formed on the free layer. Finally, the upper electrode (500) is formed over the capping layer.

Because of the small size of these MTJ cells, the directions of their magnetic moments can be easily made to fluctuate due to thermal effects. In fact, if the size is too small, it may be difficult to even obtain sufficient domain structure to maintain a stable magnetic moment. The pinned layer is fairly immune to these fluctuations because its magnetic moment is held in place by the pinning layer, but the free layer does not have this benefit and must be free to move. Ideally, it is preferred that the ferromagnetic layer is chosen from the proper material and has a thickness preferably between approximately 2.5 and 4 nanometers so that only a single domain is present. Moreover, if these devices are formed with horizontal cross-sectional shapes that are asymmetric, e.g., longer than wide, the shape asymmetry produces a magnetic asymmetry that predisposes the ferromagnetic layers to maintain a magnetic moment that is relatively stable and that returns to the same position in the absence of an external magnetic field. This stability will reduce hysteresis effects that would ordinarily cause the magnetic moment to return to a different position once the effect of an external magnetic field is removed. Such hysteresis would give rise to field strength measurements that are not reproducible and consequent errors in current measurements. Typically, the cells are formed with elliptical cross-sections having aspect ratios greater than 1.2, with a preferable dimension of the shorter axis being between approximately 0.2 and 0.5 microns.

As is finally understood by a person skilled in the art, the preferred embodiments of the present invention are illustrative of the present invention rather than limiting of the present invention. Revisions and modifications may be made to methods, materials, structures and dimensions employed in forming, providing and using an ESD protected current measuring device, while still forming, providing and using such a device in accord with the spirit and scope of the present invention as defined by the appended claims.

What is claimed is:

1. An MTJ sensor for magnetic field and current measurements comprising:

A first plurality of MTJ structures, each structure containing a second plurality of patterned MTJ cells formed between top and bottom electrodes and connected electrically in parallel thereby, each of said MTJ cells having a resistance that varies in accord with the direction and strength of an external magnetic field applied thereto;

electrical connections to said electrodes of each of said MTJ structures whereby a sensing current may be injected and extracted from each of said first plurality of MTJ structures and whereby equal portions of said current passes through each of said second plurality of MTJ cells and whereby a measurable voltage is established across each of said second plurality of MTJ cells in accord with the resistances thereof;

a conducting shunt formed in two portions on each of said first plurality of MTJ structures, each one of said two portions electrically connecting each one of said electrical connections to an external ground connection, said shunt allowing harmless passage of accumulated electrostatic charges on said MTJ structure to ground during manufacture and handling of the sensor, said charges bypassing said MTJ cells in said MTJ structure and averting electrostatic damage thereto; wherein said shunt is sufficiently resistive so that no more than approximately 5% of said sensing current passes through said shunt during operation of the sensor.

2. The MTJ sensor of claim 1 further comprising an immediately adjacent conductor not in electrical contact therewith, said conductor having two ends, for carrying a current to be measured, said current entering at one end of said conductor and leaving at said other end and said current producing a magnetic field that causes variations in the resistances of said second plurality of MTJ cells in said first plurality of MTJ structures and, thereby, causes corresponding measurable voltage changes across said MTJ cells, whereby said current can be measured.

3. he MTJ sensor of claim 1 wherein there are two MTJ structures and said immediately adjacent conductor not in electrical contact therewith is shaped in a substantially horseshoe shape with one of said two MTJ structures located approximately at each end of said horseshoe, whereby the said second plurality of MTJ cells in each of said two MTJ structures experiences said magnetic field in a direction opposite to the direction experienced by the other second plurality, whereby a measurement of the difference between voltages across each of said halves yields a measurement of said current while eliminating random effects of thermal noise and stray magnetic fields affecting the two halves of said plurality of MTJ cells.

4. The MTJ sensor of claim 1 wherein all of said MTJ cells are patterned to have an elongated horizontal cross section with an aspect ratio exceeding 1.2, whereby said MTJ cells obtain a single domain of magnetization with a stable and reproducible return point in the absence of an external magnetic field.

5. The MTJ sensor of claim 4 wherein each of said second plurality of MTJ cells in each of said first plurality of MTJ structures is patterned with an elliptical shape with its short axis parallel to the direction of the magnetic field induced by the conduction current to be measured.

6. The MTJ sensor of claim 4 wherein the patterned cells are elliptical in horizontal cross-section with an aspect ratio of at least 1.2 and with a shorter axis of between approximately 0.2 and 0.5 microns.

7. The MTJ sensor of claim 1 wherein each portion of each said shunt is formed as a meandering trace of narrow width and sufficient length to provide a resistance that is approximately 10 times the total resistance of each said MTJ structure.

8. The MTJ sensor of claim 7 wherein said trace is a patterned portion of the layer of conducting material used to form said bottom electrode of each said MTJ structure.

9. The MTJ sensor of claim 7 wherein said trace is a patterned layer of conducting material different from a layer used to form said bottom electrode.

10. The MTJ sensor of claim 7 wherein said shunt is formed of Ta or TaN.

11. The MTJ sensor of claim 1 wherein each said bottom electrode is a high resistance layer of Ta, NiCr or TaN.

12. The MTJ sensor of claim 1 wherein said top electrode of each of said first plurality of MTJ structures is formed as two collinear and coplanar separated rectangular strips, wherein lateral ends of said strips are connected to said electrical connections and sensing current is injected and extracted thereat and said bottom electrode is formed as a single substantially rectangular strip centered beneath and parallel to said top electrode and wherein an equal portion of said second plurality of MTJ cells is formed between each of said two collinear and coplanar strips and said bottom electrode.

13. The MTJ sensor of claim 12 wherein one portion of said trace is formed between each of said electrical connections and said ground connection.

14. The method of claim 13 wherein said shunt is formed of Ta or TaN.

15. A method of fabricating an MTJ sensor for measuring magnetic fields and electrical currents comprising:

providing a conductor for carrying a current to be measured, wherein said current produces a measurable magnetic field;

forming adjacent to said conductor a first plurality of MTJ structures, wherein each of said structures has two electrical contacts, one contact for injecting a sense current, the other contact for extracting said current, wherein each of said structures includes a second plurality of identical patterned MTJ cells having single domain magnetic moments, substantially elliptical horizontal cross-sections with aspect ratio greater than approximately 1.2 and with a long axis parallel to said conductor;

forming a shunt around each said MTJ structure, said shunt being formed as two substantially identical traces of high resistance wherein each said trace connects one of said electrical contacts to a ground connection, said shunt thereby harmlessly directing accumulated electrostatic charges to said ground connection thereby avoiding electrostatic damage to said MTJ cells.

16. The method of claim 15 wherein each of said first plurality of MTJ structures is formed by a method further comprising:

deposit a layer of high resistivity conductive material;

form on a first portion of said material a multilayer MTJ configuration, leaving a remaining second portion as-deposited;

in a first patterning, pattern said first portion, including said multilayer configuration and said layer of high resistivity conductive material to form a substantially rectangular region of uniform dimension;

in a second patterning, pattern said multilayer configuration to form a second plurality of substantially identical, separated MTJ cells of elliptical cross-section, the layer of high resistivity conducting material now forming a bottom electrode for each of said second plurality of MTJ cells;

form a refill layer of dielectric conformally over said MTJ cells;

planarize said dielectric layer forming a smooth coplanar surface including said dielectric and exposed tops of said MTJ cells;

form two connecting pads, wherein each pad is laterally disposed a distance away from a lateral end of said bottom electrode;

form a grounding pad adjacent to said bottom electrode;

using the remaining portion of said conductive layer, or by depositing an additional conductive layer high resistivity, pattern two traces, wherein each trace connects one of said connecting pads to said grounding pad;

form an upper electrode over the tops of said MTJ cells in two symmetric portions, wherein each said portion covers half of said second plurality of MTJ cells and extends laterally to contact a connecting pad.

17. The method of claim 16 wherein each portion of each said shunt is formed as a meandering trace of narrow width and sufficient length to provide a resistance that is approximately 10 times the total resistance of each said MTJ structure.

18. The method of claim 15 wherein there are two MTJ structures and said adjacent conductor is shaped in a substantially horseshoe shape with one of said two MTJ structures located approximately at each end of said horseshoe, whereby said second plurality of MTJ cells in each of said two MTJ structures experiences said magnetic field in a direction opposite to the direction experienced by the other second plurality, whereby a measurement of the difference between voltages across each of said halves yields a measurement of said current while eliminating random effects of thermal noise and stray magnetic fields affecting the two halves of said plurality of MTJ cells.

19. The method of claim 15 wherein each cell is patterned as an ellipse with a shorter axis between approximately 0.2 and 0.5 microns.

20. The method of claim 15 wherein each said bottom electrode is a high resistance layer of Ta, NiCr or TaN.

21. The method of claim 15 wherein each of said second plurality of MTJ cells in each of said first plurality of MTJ structures is patterned with an elliptical shape with its short axis parallel to the direction of the magnetic field induced by the conduction current to be measured.

* * * * *